(12) United States Patent
Kraus et al.

(10) Patent No.: US 8,377,803 B2
(45) Date of Patent: Feb. 19, 2013

(54) METHODS AND SYSTEMS FOR FORMING THIN FILMS

(75) Inventors: Philip A. Kraus, San Jose, CA (US);
Thai Cheng Chua, Cupertino, CA (US);
Sandeep Nijhawan, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/398,663

(22) Filed: Feb. 16, 2012

(65) Prior Publication Data
US 2012/0208352 A1    Aug. 16, 2012

Related U.S. Application Data

(63) Continuation of application No. 13/025,046, filed on Feb. 10, 2011, now Pat. No. 8,143,147.

(51) Int. Cl.
*H01L 21/36* (2006.01)

(52) U.S. Cl. .................. 438/478; 118/715; 118/723 VE; 118/723 R; 118/723 E; 118/732; 257/761; 257/763; 257/764; 257/770; 257/E21.001; 257/E21.211; 427/255.28; 427/901; 438/680; 438/381; 438/758

(58) Field of Classification Search ........................ None
See application file for complete search history.

(56) References Cited

U.S. PATENT DOCUMENTS

2002/0123239 A1* 9/2002 Doak et al. .................... 438/775
2002/0176939 A1* 11/2002 Mandrekar .................... 427/250

* cited by examiner

*Primary Examiner* — Fernando L Toledo
*Assistant Examiner* — Yasser Abdelaziez

(57) ABSTRACT

A method and apparatus for the deposition of thin films is described. In embodiments, systems and methods for epitaxial thin film formation are provided, including systems and methods for forming binary compound epitaxial thin films. Methods and systems of embodiments of the invention may be used to form direct bandgap semiconducting binary compound epitaxial thin films, such as, for example, GaN, InN and AlN, and the mixed alloys of these compounds, e.g., (In, Ga)N, (Al, Ga)N, (In, Ga, Al)N. Methods and apparatuses include a multistage deposition process and system which enables rapid repetition of sub-monolayer deposition of thin films.

19 Claims, 5 Drawing Sheets

METHODS AND SYSTEMS FOR FORMING THIN FILMS

CROSS-REFERENCE TO RELATED APPLICATIONS

This application is a continuation application and claims priority to U.S. Application Ser. No. 13/025,046 filed on Feb. 10, 2011, which is herein incorporated by reference for all purposes.

BACKGROUND OF THE INVENTION

The growth of high-quality crystalline semiconducting thin films is a technology of significant industrial importance, with a variety of microelectronic and optoelectronic applications, including light emitting diodes and lasers. The current state-of-the-art deposition technology for gallium nitride (GaN), indium nitride (InN) and aluminum nitride (AlN) thin films, their alloys and their heterostructures (also "InGaAlN" herein) is metal-organic chemical vapor deposition ("MOCVD"), in which a substrate is held at high temperature and gases which contain the elements comprising the thin film flow over and are incorporated into the growing thin film at the surface of the wafer. In the case of GaN, the state-of-the-art may include growth temperatures of approximately 1050° C. and the simultaneous use of ammonia ($NH_3$) and a Group III alkyl precursor gas (e.g., trimethylgallium, triethylgallium).

While methods exist for forming InGaAlN films, there are limitations associated with current methods. First, the high processing temperature involved in MOCVD may require complex reactor designs and the use of refractory materials and only materials which are inert at the high temperature of the process in the processing volume. Second, the high temperature involved may restrict the possible substrates for InGaAlN growths to substrates which are chemically and mechanically stable at the growth temperatures and chemical environment, typically sapphire and silicon carbide substrates. Notably, silicon substrates, which are less expensive and are available in large sizes for economic manufacturing, may be less compatible. Third, the expense of the process gases involved as well as their poor consumption ratio, particularly in the case of ammonia, may be economically unfavorable for low cost manufacturing of InGaAlN based devices. Fourth, the use of carbon containing precursors (e.g., trimethylgallium) may result in carbon contamination in the InGaAlN film, which may degrade the electronic and optoelectronic properties of the InGaAlN based devices. Fifth, MOCVD reactors may have a significant amount of gas phase reactions between the Group III and the Group V containing process gases. The gas phase reactions may result in undesirable deposition of the thin film material on all surfaces within the reaction volume, and in the undesirable generation of particles. The latter may result in a low yield of manufactured devices. The former may result in a number of practical problems, including reducing the efficacy of in-situ optical measurements of the growing thin film due to coating of the internal optical probes and lens systems, and difficulty in maintaining a constant thermal environment over many deposition cycles as the emissivity of reactor walls will change as deposition builds up on the reactor walls. These problems may be common to all the variants of MOCVD, including plasma enhanced MOCVD and processes typically referred to as atomic layer deposition (ALD) or atomic layer epitaxy (ALE).

Other methods for forming InGaAlN thin films include plasma-assisted molecular beam epitaxy ("PAMBE"), in which fluxes of evaporated Ga, In, or Al are directed in high vacuum at a heated substrate simultaneously with a flux of nitrogen radicals (either activated molecular nitrogen, atomic nitrogen, or singly ionized nitrogen atoms or molecules) from a nitrogen plasma source. The method may be capable of producing high quality InGaAlN thin films and devices, but the method may suffer from a tendency to form metal agglomerations, e.g., nano- to microscopic Ga droplets, on the surface of the growing film. See, for example, "Homoepitaxial growth of GaN under Ga-stable and N-stable conditions by plasma-assisted molecular beam epitaxy", E. J. Tarsa et al., J. Appl. Phys 82, 11 (1997), which is entirely incorporated herein by reference. As such, the process may need to be carefully monitored, which may inherently result in a low yield of manufactured devices.

Other methods employed to make GaN films include hydride vapor phase epitaxy, in which a flow of HCl gas over heated gallium results in a the transport of gallium chloride to a substrate where simultaneous exposure to ammonia results in the growth of a GaN thin film. The method may require corrosive chemicals to be used at high temperatures, which may limit the compatible materials for reactor design. In addition, the byproducts of the reaction are corrosive gases and solids, which may increase the need for abatement and reactor maintenance. While the method may produce high quality GaN films at growth rates (tens to hundreds of microns per hour have been demonstrated, exceeding those commonly achieved with MOCVD), the reactor design and corrosive process inputs and outputs are drawbacks.

SUMMARY OF THE INVENTION

In an aspect of the invention, methods for forming Group III-V-containing thin films are provided. Methods for forming Group III-V thin films may minimize, if not eliminate, thin film contamination, thereby providing for forming high quality Group III-V thin films.

In one embodiment, a method for forming a Group III-V thin film comprises contacting a substrate in a first reaction space with a Group III precursor to form a Group III metal thin film at sub-monolayer coverage; and contacting the substrate in a second reaction space with a Group V precursor, thereby forming a Group III-V thin film.

In another embodiment, a method for forming a Group III-V thin film on a substrate, comprises alternately and successively contacting a substrate with a Group III metal precursor and a Group V precursor, wherein the substrate is contacted with a Group III metal precursor and the Group V precursor in separate reaction spaces, and wherein contacting the substrate with the Group III metal precursor forms a Group III metal thin film at sub-monolayer coverage.

In another embodiment, a method for forming a Group III-V thin film on a substrate, comprises providing a Group III metal layer on a substrate, the Group III metal layer having one or more Group III metals at a pre-wetting coverage; and contacting the Group III metal layer with a Group V precursor.

In another embodiment, a method for forming a Group III-V thin film on a substrate, comprises (a) disposing a substrate in a first reaction space; (b) directing one of a first Group III precursor and a first Group V precursor into the first reaction space; (c) disposing the substrate in a second reaction space; (d) directing the other of the first Group III precursor and the first Group V precursor into the second reaction space; and (e) repeating steps (a)-(d) until a Group III metal nitride thin film of predetermined thickness is formed, wherein directing the first Group III precursor into the first reaction space or the second reaction space forms a Group III metal thin film at sub-monolayer coverage. In some embodiments, substrate may be disposed in a reaction space by moving the substrate to the reaction space (e.g., by rotating a susceptor having the substrate to the reaction space). In other embodiments, the substrate may be disposed in a reaction space by bringing the reaction space to the substrate (e.g., by rotating a reaction chamber having the reaction space).

In another embodiment, a method for forming a Group III-V thin film on a substrate, comprises: (a) moving a substrate to a first reaction space; (b) contacting the substrate with one of a first Group III precursor and a first Group V precursor in the first reaction space; (c) moving the substrate to a second reaction space; (d) contacting the substrate with the other of the first Group III precursor and the first Group V precursor in the second reaction space; and (e) repeating steps (a)-(d) until a Group III-V thin film of predetermined thickness is formed, wherein contacting the substrate with the first Group III precursor forms a Group III metal thin film at sub-monolayer coverage.

In one embodiment, the Group III-V thin film may comprise epitaxial layers of gallium nitride and/or indium gallium nitride. In another embodiment, the Group III-V thin film may comprise epitaxial layers of aluminum nitride, aluminum gallium nitride, gallium nitride, indium gallium nitride, or aluminum indium gallium nitride.

In another aspect of the invention, systems and apparatuses for forming Group III-V thin films are provided. In one embodiment, an apparatus for depositing a Group III-V thin film on a target (e.g., substrate) comprises a first reaction space and a second reaction space, the first reaction space fluidically separated from the second reaction space; a susceptor for bringing a target in contact with each of the first and second reaction spaces; and a controller for directing a Group III precursor into the first reaction space at a first exposure and a Group V precursor into the second reaction space at a second exposure.

In another aspect of the invention, Group III-V thin films are provided. In one embodiment, a Group III-V thin film is provided having a root mean square of height differences of less than or equal to about 10 nanometers (nm) when measured by atomic force microscopy (AFM). In some embodiments, the root mean square of height differences may be less than or equal to about 5 nm, or less than or equal to about 2 nm. The Group III-V thin film may have a defect density of at most about $10^{10}$ dislocations/cm$^2$. The Group III-V thin film may have a full-width at half maximum of the omega scan of the (0002) or (10$\bar{1}$2) x-ray reflections of less than or equal to about 600 arcseconds.

In embodiments, methods provided herein may be used to form Group III-V thin films. In one embodiment, a light emitting diode (LED) having a Group III-V thin film may be formed using methods provided herein. In another embodiment, a photovoltaic solar cell having a Group III-V thin film may be formed using methods provided herein. In another embodiment, a quantum well heterostructure device having a Group III-V thin film may be formed using methods provided herein. In another embodiment, a multiple quantum well heterostructure having a Group III-V thin film may be formed using methods provided herein.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 3A schematically illustrates a system including two reaction spaces; FIG. 3B schematically illustrates a system including three reaction spaces; FIG. 3C schematically illustrates a system including four reaction spaces, FIG. 3D schematically illustrates a system including five reaction spaces; and FIG. 3E schematically illustrates a system including six reaction spaces, in accordance with an embodiment of the invention;

DETAILED DESCRIPTION OF THE INVENTION

Figure 1:
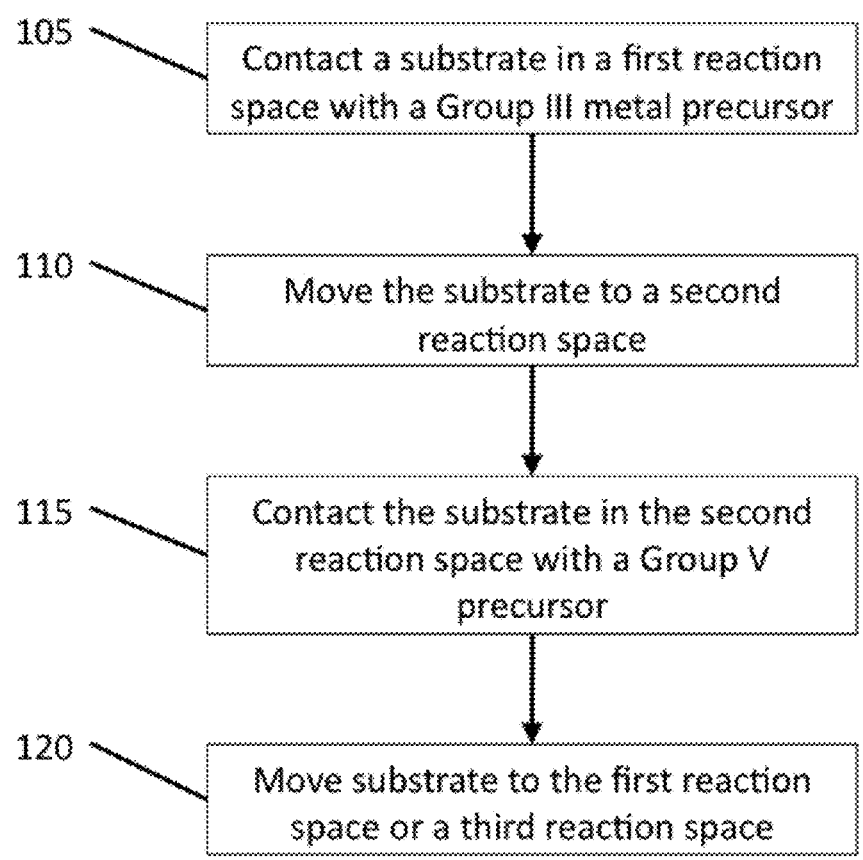
FIG. 1 illustrates a method for forming a Group III-V thin film, in accordance with an embodiment of the invention.

While various embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention.

Methods and systems provided herein enable formation of Group III-V thin films while reducing, if not eliminating, problems associated with current systems and methods. In some embodiments, methods are provided for forming Group III-V thin films while reducing, if not eliminating, contamination of Group III-V thin films. Thin films formed according to methods and systems provided herein may be used in various applications, such as, for example, photovoltaic solar cell and light emitting diode (LED) devices and systems.

In embodiments, systems and methods are provided for forming Group III-V thin films. In some embodiments, time and space co-divided systems and methods are described in which a first precursor is brought in contact with a substrate in a first reaction space and a second precursor is brought in contact with the substrate in a second reaction space that is separate from the first reaction space. In one embodiment, the first precursor is a Group III metal precursor, and exposure of the substrate to the Group III metal precursor forms a Group III metal thin film at sub-monolayer coverage. In another embodiment, the substrate is brought in contact with one or more Group III metal precursors in the same reaction space or different reaction spaces, and exposure of the substrate to the one or more Group III metal precursors is separated by exposure of the substrate to a Group V precursor, a hydrogen-containing species, or other processing, such as, e.g., spectroscopies to determine thin film quality or composition.

The term "reaction space", as used herein, may refer to any environment suitable for deposition of a material film or thin film on or over a substrate, or the measurement of the physical characteristics of the material film or thin film. In one embodiment, a reaction space may include a chamber. In another embodiment, a reaction space may include a chamber in a system having a plurality chambers. In another embodiment, a reaction space may include a chamber in a system having a plurality of fluidically separated chambers. In another embodiment, a system may include multiple reactions spaces, wherein each reaction space is fluidically separated from another reaction space. In another embodiment, a reaction space may be suitable for conducting measurements on a substrate or a thin film formed on the substrate (or target).

The term "metal nitride", as used herein, may refer to a material comprising one or more metals or one or more semiconductors, and nitrogen. In certain embodiments, a metal nitride (e.g., metal nitride thin film) may have the chemical formula $M_xN_y$, wherein 'M' designates a metal or a semiconductor, 'N' designates nitrogen, and 'x' and 'y' are numbers greater than zero. In some embodiments, 'M' may comprise one or more metals and/or semiconductors. In embodiments, $M_xN_y$ may refer to a metal nitride, such as a Group III metal nitride (e.g., gallium nitride, indium nitride, aluminum gallium nitride, indium gallium aluminum nitride). In some embodiments, a metal nitride film or thin film may comprise other materials, such as, e.g., chemical dopants. Chemical dopants may include p-type dopants (e.g., magnesium, zinc) and n-type dopants (e.g., silicon, oxygen).

The terms "excited species" and "activated species", as used herein, may refer to radicals, ions and other excited (or activated) species generated via application (or coupling) of energy to a reactant gas or vapor. In an embodiment, energy may be applied via a variety of methods, such as, e.g., ultraviolet radiation, microwave radiation, inductive coupling and capacitive coupling, such as with the aid of a plasma generator. The plasma generator may be a direct plasma generator (i.e., direct plasma generation) or a remote plasma generator (i.e., remote plasma generation). In the absence of coupling energy, plasma generation is terminated. For remote plasma generation, plasma-excited species of a particular vapor phase chemical (e.g., nitrogen-containing plasma species) may be formed in a plasma generator in fluid communication with (or fluidically coupled to) a reaction space having a substrate to be processed. In another embodiment, energy may be applied by exposure of a species of gas to hot (or heated) surfaces or wires, where the interaction of the gas with the heated surfaces or wires generates excited (or activated) species of the gas.

The term "nitrogen-containing species", as used herein, may include, without limitation, nitrogen radicals, nitrogen ions, and excited (or active) neutral species of nitrogen. In one embodiment, the gaseous source of nitrogen-containing species may include, without limitation, $N_2$, $NH_3$, and/or hydrazine. In another embodiment, the gaseous source of nitrogen-containing species may include mixtures of $N_2$ and $H_2$ gases. In another embodiment, excited nitrogen-containing species may be provided via remote plasma generation or direct plasma generation. In another embodiment, excited nitrogen-containing species may be provided by the thermal disassociation of nitrogen-containing species by exposure to hot surfaces or wires. Coupling energy to a mixture of $N_2$ and $H_2$ gases may generate excited molecular $NH_x$, wherein 'x' is a number greater than or equal to 1.

The term "hydrogen-containing species", as used herein, may include, without limitation, hydrogen radicals, hydrogen ions, and excited (or active) neutral species of hydrogen ($H_2$). In one embodiment, hydrogen-containing species includes $H_2$. In another embodiment, the gaseous source of hydrogen-containing species may include, without limitation, $H_2$, $NH_3$, and/or hydrazine. In another embodiment, the gaseous source of hydrogen-containing species may include mixtures of $H_2$ and $N_2$ gases. In another embodiment, excited hydrogen-containing species may be provided via remote plasma generation or direct plasma generation. In another embodiment, excited hydrogen-containing species may be provided by the thermal disassociation of hydrogen-containing species by exposure to hot surfaces or wires. It will be appreciated that excited hydrogen-containing species may include neutral hydrogen-containing species, such as $H_2$.

The term "adsorption", as used herein, may refer to chemical or physical attachment of atoms or molecules on a surface, such as a substrate surface or a surface of a film or thin film on or over a substrate.

The term "substrate", as used herein, may refer to any workpiece on which film or thin film formation is desired. Substrates may include, without limitation, silicon, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof.

The term "surface", as used herein, may refer to a boundary between the reaction space (or environment) and a feature of the substrate.

The term "monolayer", as used herein, may refer to a single layer of atoms or molecules. In one embodiment, a monolayer includes a monoatomic monolayer (ML) having a thickness of one atomic layer. In another embodiment, a monolayer includes the maximum coverage of a particular species on a surface. In such a case, all individual members of the surface adsorbed species may be in direct physical contact with the surface of the underlying substrate, thin film or film. The term "sub-monolayer coverage", as used herein, may refer to a layer of a particular species at a coverage less than one monoatomic monolayer. In one embodiment, a layer of a particular species at sub-monolayer coverage may permit additional adsorption of the species or another species. In another embodiment, sub-monolayer coverage may be referred to as "pre-wetting" coverage. For example, a layer of a Group III metal, such as gallium (Ga), indium (In) or aluminum (Al), may include Ga, In or Al atoms collectively having a coverage of about 0.5 ML on a surface, which may be provided with respect to the maximum collective coverage of Ga, In or Al atoms on the surface. In one embodiment, the maximum coverage of a species on a surface is determined by the attractive and repulsive interaction between adsorbed species on the surface. In another embodiment, a layer of a species at a coverage of one monolayer cannot permit additional adsorption of the species in the layer. In another embodiment, a layer of a particular species at a coverage of one monolayer may permit the adsorption of another species in the layer.

The term "exposure", as used herein, may refer to the product of pressure (P) and time (t), i.e., P×t, wherein 'P' and 't' are provided in units of ton and seconds, respectively. For example, a substrate exposed to a Group III metal precursor at a pressure of $1 \times 10^{-6}$ torr for a period of 60 seconds is contacted with the Group III metal precursor at an exposure (or dosage) of $1 \times 10^{-6}$ torr×60 seconds, or $60 \times 10^{-6}$ torr*s, or 60 Langmuir (L).

The term "precursor", as used herein, may refer to a liquid or vapor phase chemical having a species of interest for deposition on a substrate surface. A Group III metal precursor may include a chemical compound that includes one or more Group III metal atoms, such as one or more of Ga, In and Al. A Group V precursor may include a chemical that includes one or more Group V atoms, such as one or more of nitrogen, arsenic and phosphorous. Upon interaction between a substrate surface and a Group III precursor or a Group V precursor, the Group III precursor or the Group V precursor may dissociate to yield a Group III chemical (or adatoms of the Group III atom) or a Group V chemical (or adatoms of the Group V atom) on the substrate surface.

Methods for Forming Group III-V Thin Films

In one aspect of the invention, a method for forming a Group III-V thin film comprises providing a substrate in a first reaction space, contacting the substrate in the first reaction space with a Group III metal precursor (also "Group III precursor" herein) to form a Group III metal thin film, moving the substrate to a second reaction space, and contacting the substrate in a second reaction space with a Group V precursor, thereby forming a Group III-V thin film. In one embodiment, contacting the substrate in the first reaction space with the Group III precursor forms a Group III metal thin film at sub-monolayer coverage.

In some embodiments, prior to contacting the substrate with the Group V precursor, the substrate, including the Group III metal thin film on the substrate, is contacted with a hydrogen-contain species. In one embodiment, the hydrogen-containing species includes $H_2$. In another embodiment, the hydrogen-containing species includes excited species of hydrogen, including one or more of hydrogen cations, hydrogen anions and hydrogen radicals. In one embodiment, excited species of hydrogen may be provided via remote plasma generation or direct plasma generation. In another embodiment, excited species of hydrogen may be provided by the thermal disassociation of molecular hydrogen by exposure of $H_2$ gas to hot surfaces or wires.

In one embodiment, the substrate may be contacted with a hydrogen-containing species in the first reaction space. In such a case, the first reaction space may be evacuated with the aid of purging and/or pumping prior to contacting the substrate with the hydrogen-containing species.

In one embodiment, prior to contacting the substrate in the second reaction space with the Group V precursor, the substrate is moved to a third reaction space and contacted with a hydrogen-containing species in the third reaction space. The third reaction space may be disposed in-between the first and second reaction spaces. In another embodiment, contacting a Group III metal thin film with excited species of hydrogen may reduce multi-layer Group III islands to islands of monoatomic height (or thickness).

In embodiments, following the second reaction space, the substrate is moved to the first reaction space. In other embodiments, following the second reaction space, the substrate is moved to a third reaction space. In one embodiment, in the third reaction space the substrate is contacted with a Group III metal precursor. In another embodiment, in the third reaction space the substrate is contacted with a Group III metal precursor that is different from the Group III metal precursor exposed to the substrate in the first reaction space. In another embodiment, following the third reaction space, the substrate is moved to one or more additional reaction spaces for separate exposure to a Group III metal precursor and a Group V precursor. In another embodiment, in-between exposure to a Group III or Group V precursor, the substrate may be exposed to other species, such as hydrogen-containing species, which may aid in maintaining film stoichiometry and in reducing thin film contamination.

In some embodiments, after forming a Group III-V thin film on the substrate, the substrate, including the Group III-V thin film on the substrate, is contacted with a hydrogen-containing species. In another embodiment, the substrate is contacted with a hydrogen-containing species in the second reaction space. In such a case, the second reaction space may be evacuated with the aid of purging and/or pumping prior to contacting the substrate with a hydrogen-containing species. In another embodiment, the substrate is moved to a third reaction space and contacted with a hydrogen-containing species in the third reaction space. The third reaction space may be disposed in-between the first and second reaction spaces. In one embodiment, the third reaction space is difference from the first and second reaction spaces.

Methods of embodiments of the invention may be used to form Group III-V thin films, such as thin films including nitrogen and one or more of aluminum (Al), gallium (Ga) and indium (In). In one embodiment, methods are provided for forming GaN thin films. In another embodiment, methods are provided for forming AlN thin films. In another embodiment, methods are provided for forming InN thin films. In another embodiment, methods are provided for forming AlGaN thin films. In another embodiment, methods are provided for forming AlInN thin films. In another embodiment, methods are provided for forming GaInN thin films. In another embodiment, methods are provided for forming InGaAlN thin films.

In one embodiment, in the first reaction space the substrate is contacted with a single Group III metal precursor. In another embodiment, in the first reaction space the substrate is contacted with multiple Group III metal precursors, such as one or more of Al, Ga and In-containing precursors. In another embodiment, the substrate is contacted with different Group III metal precursors in separate reaction spaces. In one embodiment, the substrate is contacted with a Group V precursor between exposures to Group III metal precursors.

In one embodiment, the first reaction space is different from the second reaction space. In another embodiment, the first reaction space is fluidically separated from the second reaction space. In another embodiment, the first reaction space and the second reaction space are separate pressure-regulated environments. In another embodiment, gases from the first reaction space are prevented from entering the second reaction space, and gases from the second reaction space are prevented from entering the first reaction space.

In one embodiment, a Group III-V thin film may have a thickness between about 1 nanometer ("nm") and 100 micrometers, or 1 nm and 10 micrometers, or 10 nm and 1000 nm, or 20 nm and 500 nm. In another embodiment, a Group III-V thin film may have a thicknesses less than about 100 micrometers, or less than about 10 micrometers, or less than about 1000 nm, or less than about 500 nm, or less than about 100 nm. In another embodiment, Group III-V thin films may be formed at a growth rate of at least about 10 nm/hour, or at least about 100 nm/hour, or at least about 1000 nm/hour, or at least about 5000 nm/hour. In another embodiment, Group III-V thin films may be formed at a growth rate of less than about 5000 nm/hour, or less than about 1000 nm/hour, or less than about 500 nm/hour, or less than about 400 nm/hour, or less than about 300 nm/hour, or less than about 200 nm/hour, or less than about 100 nm/hour.

With reference to FIG. 1, a method for forming a Group III-V thin film is illustrated, in accordance with an embodiment of the invention. In a first step 105, with the substrate disposed in a first reaction space, the substrate is contacted with a Group III metal precursor (e.g., trimethyl gallium) to form a Group III metal thin film on the substrate. The substrate may be disposed in the first reaction space by moving the substrate (e.g., moving or rotating a susceptor having the substrate) to the first reaction space or moving the first reaction space (e.g., rotating the first reaction space) to the substrate. In one embodiment, the substrate is contacted for a time period no more than that required to form a Group III metal thin film at sub-monolayer coverage. In another embodiment, contacting the substrate in the first reaction space with the Group III metal precursor forms a layer of a Group III metal having a thickness less than about 1 monolayer (ML), or less than 0.95 ML, or less than 0.9 ML, or less than 0.85 ML, or less than 0.8 ML, or less than 0.75 ML, or less than 0.7 ML, or less than 0.65 ML, or less than 0.6 ML, or less than 0.55 ML, or less than 0.5 ML, or less than 0.45 ML, or less than 0.40 ML, or less than 0.35 ML, or less than 0.30 ML, or less than 0.25 ML, or less than 0.20 ML, or less than 0.15 ML, or less than 0.10 ML, or less than 0.05 ML. In another embodiment, contacting the substrate in the first reaction space with the Group III metal precursor forms a layer of a Group III metal having a thickness up to about 0.05 ML, or 0.1 ML, or 0.15 ML, or 0.2 ML, or 0.25 ML, or 0.3 ML, or 0.35 ML, or 0.4 ML, or 0.45 ML, or 0.5 ML, or 0.55 ML, or 0.6 ML, or 0.65 ML, or 0.7 ML, or 0.75 ML, or 0.8 ML, or 0.85 ML, or 0.9 ML, or 0.95 ML, or 1 ML. In another embodiment, contacting the substrate in the first reaction space with the Group III metal precursor forms a layer of a Group III metal at sub-monolayer coverage.

In one embodiment, an exposure of the Group III metal precursor may be selected to provide a Group III metal thin film at a predetermined coverage. Coverage may be assessed by a variety of spectroscopy tools (see below), such as x-ray photoelectron spectroscopy (XPS). In achieving a predetermined coverage of a Group III metal thin film, it will be understood that a trial-and-error approach may be used to find an exposure of the Group III metal precursor corresponding to the predetermined coverage. For example, in one system it may be determined that achieving a Group III metal thin film coverage at 0.3 ML coverage requires exposure of a substrate (also "target" herein) to a Group III metal precursor at about 1 L.

Next, in step 110, the substrate is disposed in a second reaction space. In some embodiments, the substrate may be moved to the second reaction space. In other embodiments, the second reaction space may be moved (e.g., rotated) to the substrate. In one embodiment, movement of the substrate to the second reaction space comprises rotating a susceptor from the first reaction space to the second reaction space.

Next, in step 115, with the substrate in the second reaction space, the substrate, including the Group III metal thin film on the substrate, is contacted with a Group V precursor to form a Group III-V-containing thin film. In one embodiment, the Group III-V-containing thin film includes Group III-V species. In another embodiment, prior to contacting the substrate with the Group V precursor, the substrate may be contacted with hydrogen-containing species (e.g., $H_2$, excited species of hydrogen). The substrate may be contacted with hydrogen-containing species in the first reaction space, the second reaction space, or a third reaction space. In one embodiment, prior to contacting the substrate with hydrogen-containing species, a reaction space having the substrate may be evacuated with the aid of purging and/or pumping.

In one embodiment, the Group V precursor includes a nitrogen-containing species. In another embodiment, the Group V precursor includes plasma-excited species of nitrogen. In another embodiment, the Group V precursor includes active neutral species of nitrogen. In another embodiment, the Group V precursor includes active neutral species of nitrogen comprises nitrogen species having the lowest excited state of molecular nitrogen ($A^3\Sigma_u^+$). In one embodiment, the substrate is contacted for a time period no more than that required to form a Group III-V thin film at sub-monolayer coverage. In another embodiment, contacting the substrate in the second reaction space with the Group V precursor forms a Group III-V thin film having a thickness less than about 1 ML, or less than 0.95 ML, or less than 0.9 ML, or less than 0.85 ML, or less than 0.8 ML, or less than 0.75 ML, or less than 0.7 ML, or less than 0.65 ML, or less than 0.6 ML, or less than 0.55 ML, or less than 0.5 ML, or less than 0.45 ML, or less than 0.40 ML, or less than 0.35 ML, or less than 0.30 ML, or less than 0.25 ML, or less than 0.20 ML, or less than 0.15 ML, or less than 0.10 ML, or less than 0.05 ML. In another embodiment, contacting the substrate in the second reaction space with the Group V precursor forms a Group III-V thin film having a thickness up to about 0.05 ML, or 0.1 ML, or 0.15 ML, or 0.2 ML, or 0.25 ML, or 0.3 ML, or 0.35 ML, or 0.4 ML, or 0.45 ML, or 0.5 ML, or 0.55 ML, or 0.6 ML, or 0.65 ML, or 0.7 ML, or 0.75 ML, or 0.8 ML, or 0.85 ML, or 0.9 ML, or 0.95 ML, or 1 ML. In another embodiment, contacting the substrate in the second reaction space with the Group V precursor forms a Group III-V thin film at sub-monolayer coverage.

In some embodiments, plasma-excited species of nitrogen may include a nitrogen and hydrogen-containing species formed by providing energy to a mixture of $N_2$ and $H_2$ gases, $NH_3$, a mixture of $N_2$ and $NH_3$, hydrazine ($N_2H_4$), and/or a mixture of $N_2$ and $N_2H_4$. In one embodiment, plasma-excited species of nitrogen include $NH_x$, wherein 'x' is a number greater than or equal to 1. For example, plasma-excited species of nitrogen may include one or more of NH, $NH_2$ and $NH_3$, and ions and radicals of such species, such as, for example, $NH^+$, $NH_2^+$, $NH_3^+$. In another embodiment, plasma-excited species of nitrogen are formed by inductively coupling energy to a mixture of $N_2$ and $H_2$ gases having a ratio of $N_2$ and $H_2$ flow rates of about 0.5:1, or 1:1, or 2:1, or 3:1, or 4:1, or 5:1. In another embodiment, plasma-excited species of nitrogen are formed by inductively coupling energy to a mixture of $N_2$ and $H_2$ gases having an $H_2$ flow rate that is about ⅓ (or 0.333) of the total $N_2$ and $H_2$ flow rate.

In embodiments, the substrate may be contacted with Group III and Group V precursors until a Group III-V-containing thin film of predetermined thickness is formed on the substrate.

With continued reference to FIG. 1, in step 120, the substrate is moved to the first reaction space or a third reaction space. In one embodiment, the substrate is moved to the first reaction space and contacted with a Group III metal precursor. In another embodiment, the substrate is moved to a third reaction space that is different from the first and second reaction spaces. In the third reaction space, the substrate may be contacted with a Group III metal precursor, a Group V precursor, or another species. For example, the substrate may be contacted with vapor phase chemical to aid in removing contaminants (e.g., carbon) from a Group III-V thin film formed on the substrate.

In one embodiment, the substrate is moved to successive reaction spaces (see below) until a thin film of predetermined thickness and composition is formed.

In one embodiment, the substrate may be moved to the first reaction space to repeat steps 105 to 120, as described above.

In one embodiment, after the second reaction space, the substrate may be moved to one or more environments that include one or more thin film diagnostic tools, such as one or more thin film spectroscopy tools, to aid in assessing the physical characteristics (e.g., conductivity, thickness, long-range periodicity, composition) and/or quality of a thin film formed on the substrate. Spectroscopy tools may include reflection-absorption infrared spectroscopy (RAIRS), low-energy electron diffraction (LEED) spectroscopy, x-ray photoelectron spectroscopy (XPS), Auger electron spectroscopy (AES), scanning probe microscopy (STM, AFM), near edge x-ray absorption fine structure (NEXAFS), spectral reflectance and transmission, single wavelength reflectance and transmission, optical pyrometry (single wavelength, dual wavelength, or using spectral radiometry), emmisometry, ellipsometry, surface light scattering, and optical polarimetry.

Systems for Forming Group III-V Thin Films

In another aspect of the invention, an apparatus for depositing a Group III-V thin film on a target is provided. The apparatus comprises a first reaction space and a second reaction space, the first reaction space fluidically separated from the second reaction space. The apparatus further includes a susceptor or substrate holder for bringing a target (or substrate) in contact with each of the first and second reaction spaces. In one embodiment, the apparatus includes a controller (see, e.g., FIG. 2) for directing a Group III precursor into the first reaction space at a first exposure and a Group V precursor into the second reaction space at a second exposure. In another embodiment, the first exposure is for providing a layer of a Group III metal at sub-monolayer (or pre-wetting) coverage.

Figure 2:
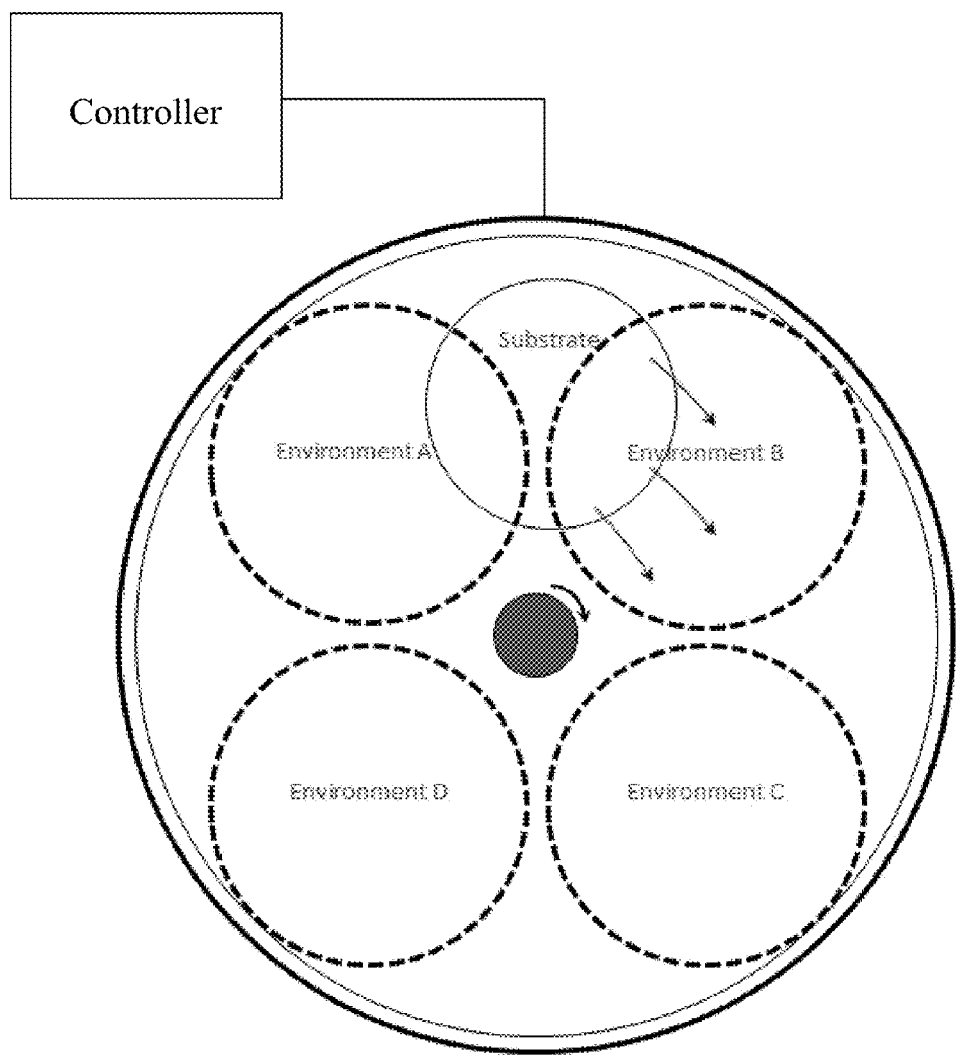
FIG. 2 schematically illustrates a cross-sectional top view of a rotational system for the cyclic motion of one or more substrates through separated processing environments, in accordance with an embodiment of the invention. Processing environments A, B, C, and D may be any of the environments described in the text, including a Group III environment, a Group V environment, a metrology environment, or a hydrogen-containing species (e.g., $H_2$, excited species of hydrogen) environment, in their various combinations. More than one location may be of a given type of environment. In the illustrated embodiment of FIG. 2, the environments are stationary and the substrates rotate through the multiple environments on a substrate carrier structure (or "susceptor"), which rotates about a central axis, in accordance with an embodiment of the invention.
Figure 3A:
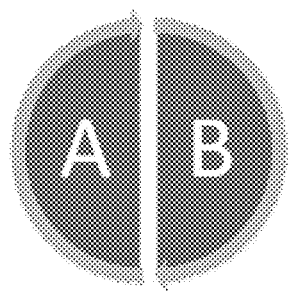
FIGS. 3A-3E are schematic cross-sectional top views of thin film deposition systems having various configurations of a rotational system for the motion (e.g., cyclic motion) of one or more substrates through separated reaction spaces, in accordance with various embodiments of the invention.
Figure 3B:
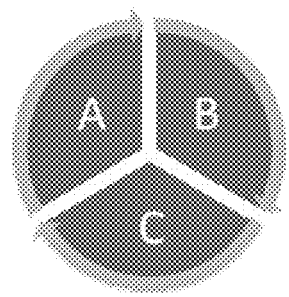
Figure 3C:
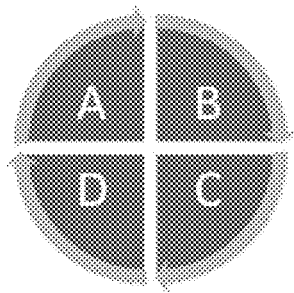
Figure 3D:
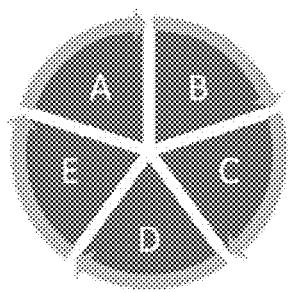
Figure 3E:
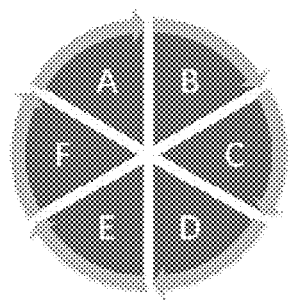

In embodiments, a number of the practical problems with the state of the art for the deposition of binary semiconducting thin films may be mitigated by separating the environment (or reaction space) in which the Group III metal atoms are deposited onto a substrate from the environment in which these adsorbed metal atoms are exposed to a Group V-containing precursor gas to form the Group III-V thin film or compound. In one embodiment, the substrate is moved between deposition reaction spaces (or environments) cyclically to deposit a film of a predetermined thickness. FIG. 2 is an example of a system of linked sequential processing environments, which may be constructed for this purpose.

In one embodiment, this technique may mitigate the gas phase reaction between Group III and Group V-containing precursor gases, because the Group III and Group V precursor gases will not be present in significant amounts in the same reaction volume due to flow and pressure control of each individual reaction space. Maintaining separate environments further allows for optimization of the environment for the delivery of Group III adatoms to the surface, and a separate environment (or reaction space) where the delivery of the Group V precursor is optimized for surface reaction to form the desired III-V compound. In the case of InGaAlN films, the Group III metal delivery may be optimized for use of metal organic precursors such as (here described for the case of gallium; similarly for other Group III metals) trimethylgallium, triethylgallium, diethylgallium chloride, and coordinated gallium hydride compounds, e.g., dimethylgallium hydride, etc.; thermal evaporation of the Group III material; or gaseous Group III chlorides or Group III halides, among other methods. In one embodiment, in the case of InGaAlN thin films, the nitridation environment may be optimized for various methods to deliver active nitrogen to the wafer surface, including plasma excitation or thermal disassociation of nitrogen-containing species.

The separate deposition environments for Group III and Group V elements may enable incompatible processes in each of the independent environments. For example, different gas flows and pumping speeds may be used in the Group III and Group V environments. Additionally, mechanisms useful for the creation of reactive Group V species but detrimental to the delivery of Group III precursors, for example ionization and disassociation via plasma excitation, may be used without constraints due to the absence of Group III precursors in the Group V reaction environment.

Figure 4:
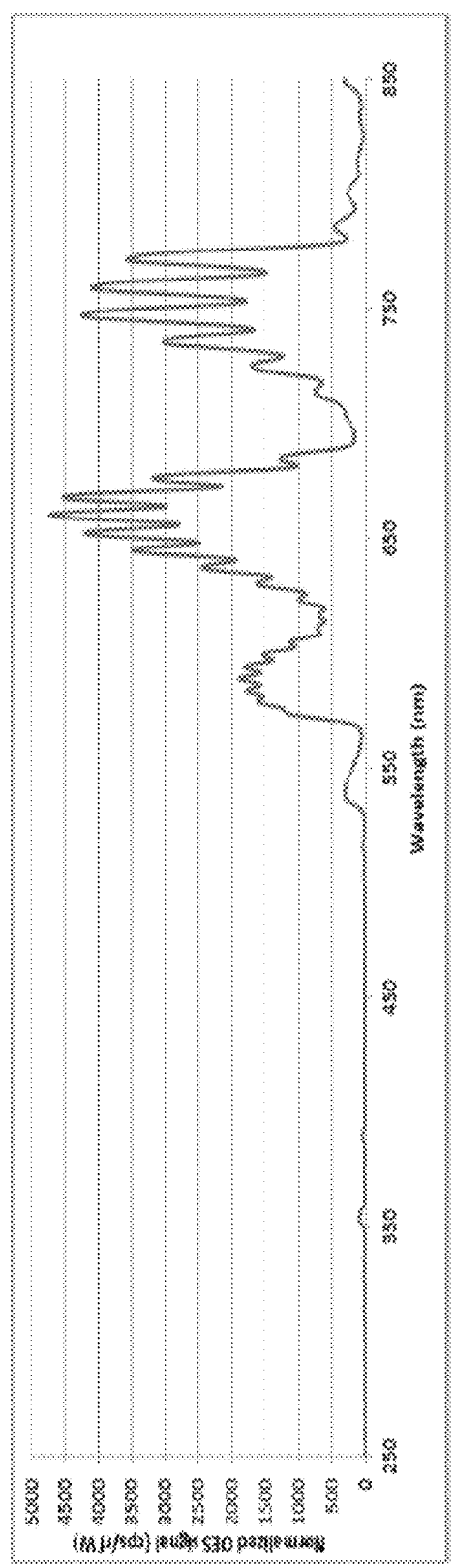
FIG. 4 is an optical emission spectrum of a radio-frequency inductively coupled plasma excitation of $N_2$ gas, where the strong majority of optical transitions are into the lowest energy band for excited $N_2$ molecules (approximately 600 to 800 nm emission bands, referred to as the $1^{st}$ positive series), in accordance with an embodiment of the invention. The absence of strong emission in the approximate range 300 to 400 nm, referred to as the $2^{nd}$ positive series, may be indicative of a lack of higher energy excited $N_2$ molecules.

The various molecular excitation states of $N_2$ gas may be characterized by the use of optical emission spectroscopy. See, for example, *The identification of molecular spectra*, R. W. B. Pearse and A. G. Gaydon, Chapman and Hall, 1976, which is entirely incorporated herein by reference. Optical emissions are the result of transitions from a higher energy excited state to a lower energy state. For the $N_2$ molecule, the group of transitions in the region of approximately 600 nanometer (nm) to 800 nm (which may be referred to as the '$1^{st}$ positive series' of $N_2$ emission lines) result from transitions which terminate in a band of states with a minimum excitation energy of approximately 6 electron volts (eV). This is the lowest internal energy of the excited states of the neutral $N_2$ molecule. An optical emission spectrum from an inductively-coupled plasma excitation of $N_2$ gas is shown in FIG. 4. These emission characteristics indicate that a strong majority of the excited $N_2$ molecules in this population has approximately 6 eV of internal energy. In one embodiment, this excitation of $N_2$ gas may be used for InGaAlN thin film deposition.

Because of the separate Group III and Group V deposition environments, the Group III metal adatoms are not instantaneously reacted with Group V atoms. The technique results in an increase in the surface mobility of adsorbed metal atoms, which promotes improved crystalline quality by allowing additions to the growing surface to be made at highly coordinated, low energy sites. The technique in general promotes two-dimensional growth where growth takes place at atomic step edges. See, for example, "2.6 µm/hr High-Speed Growth of GaN by RF-Molecular Beam Epitaxy and Improvement of Crystal Quality by Migration Enhanced Epitaxy," D. Sugihara et al., Phys. Stat. Sol. (a) 176, 323 (1999), which is entirely incorporated herein by reference. In one embodiment, this technique may promote the growth of two-dimensional islands (i.e., islands having a thickness of one atomic layer). In another embodiment, this technique may promote the growth of three-dimensional islands (i.e., islands having a thickness of a plurality of atomic layers).

Methods of embodiments of the invention may enable the use of lower substrate temperatures than is typical in the state of the art MOCVD due to the improved crystalline quality resulting from the increased surface migration of metal adatoms. For example, Sugihara et al. report 750° C. for their GaN growths, compared to approximately 1050° C. for typical MOCVD. Reduced processing temperatures relative to the state of the art enable the use of less costly substrates and a simplified reactor design.

Separation of the Group III and Group V deposition environments necessarily creates a situation where the surface of the substrate will have an excess of Group III atoms for a portion of the deposition cycle. Group III metals, in particular Ga and In, may form droplets on the substrate surface when the Group III element is in excess of the stoichiometric amount of the Group V element needed to form the desired III-V compound. For example see D. Sugihara et al., and "Epitaxial Growth of GaN on Sapphire (0001) Substrates by Electron Cyclotron Resonance Molecular Beam Epitaxy," S. H. Cho et al., Jpn. J. Appl. Phys. 34, L236 (1995), which is entirely incorporated herein by reference. Group III metal droplets which do not dissolve during processing and remain in the film may damage the optoelectronic material properties and may be incompatible with device manufacture.

Methods of embodiments of the invention may enable Group III metal droplet formation to be mitigated, if not eliminated, by depositing a sub-monolayer coverage of the Group III metal during each cycle. At this coverage, the Group III metal thickness may be less than the wetting layer thickness, and metal droplet formation may be suppressed. Additionally, sub-monolayer coverage of metal adatoms reduces the number of interactions between the adatoms, reducing their self-scattering and increasing the adatom surface mobility.

In embodiments, hydrogen-containing species may be used during the formation of the Group III-V thin film on a substrate. The hydrogen-containing species may be maintained in a separate environment from the Group III and Group V reaction environments, and may be employed after Group III environment, after Group V environment, or both. In one embodiment, hydrogen-containing species may be brought in contact with a substrate, a Group III metal film, or a Group III-V film on the substrate in a reaction space that is separate from a reaction space having a Group III or Group V precursor. In an embodiment, an environment comprising hydrogen-containing species may be employed sequentially after a Group V reaction space, where excess Group III atoms or droplets will be converted to Group III halides, e.g., $GaH_3$. Group III halides may be volatile, and droplets will be removed from the surface each cycle. This allows the growth surface to be stoichiometric at the beginning of each deposition cycle. In another embodiment, an environment comprising hydrogen-containing species may be employed sequentially after a Group III reaction space, where the excited species of hydrogen may reduce multi-layer Group III islands to islands of monoatomic height (or thickness).

In one embodiment, an additional benefit of exposing the film to hydrogen-containing species is that activated species of hydrogen may scavenge (or getter) carbon atoms and/or hydrocarbon groups, which are due to residual contamination from the alkyl groups present in metal organic precursors. See, for example, Bornscheuer et al., "Production of Atomic Hydrogen and its Use for the Growth of GaN with Low Carbon Level," Phys. Stat. Sol. (a) 159, 133 (1997), and Kim et al., "Effect of Hydrogen on GaN Growth by Remote Plasma-Enhanced Metal-Organic Chemical Vapor Deposition," Phys. Stat. Sol. (a) 176, 337 (1999), which are entirely incorporated herein by reference. In another embodiment, plasma-excited hydrogen-containing species may be used to scavenge and remove one or more impurity species selected from carbon, sulfur and oxygen. This may advantageously minimize, if not eliminate, further contamination of the substrate or thin film over the substrate.

In embodiments, an additional environment may be maintained where thin film properties may be measured in-situ. In this environment no deposition occurs and the optical viewports, lens systems, spectroscopies, and other ports needed to make stable and accurate measurements may be maintained. Measurements which could be performed in this environment include, but are not limited to, reflection-absorption infrared spectroscopy (RAIRS), low-energy electron diffraction (LEED) spectroscopy, x-ray photoelectron spectroscopy (XPS), Auger electron spectroscopy (AES), scanning probe microscopy (STM, AFM), near edge x-ray absorption fine structure (NEXAFS), spectral reflectance and transmission, single wavelength reflectance and transmission, optical pyrometry (single wavelength, dual wavelength, or using spectral radiometry), emmisometry, ellipsometry, surface light scattering, and optical polarimetry. Thin film data gathered from measurements, such as those made with the aid of tools (e.g., spectrometers) provided herein, may include thickness, dielectric constant, conductivity (or resistivity), optical attenuation constant, temperature, and emissivity. Such data may be used in a real-time closed loop control system, where aspects of the deposition environments may be actuated to maintain the measured parameters within a specified tolerance. This arrangement may provide for thin film property optimization, device performance optimization, thin film deposition parameter optimization (e.g., optimization of reaction space pressures, deposition temperatures, flow rates), run-to-run repeatability, system-to-system repeatability and matching, and improved yield of manufactured goods.

FIG. 3 depicts several examples of simplified representations of various configurations possible of a rotational system for the cyclic motion of one or more substrates through separated processing environments, where the environments are any of those described.

To summarize, the separation of the Group III and Group V deposition environments to form a III-V compound, and the cyclic motion of a substrate through these separated environments, where the formation of metal droplets is suppressed by using sub-monolayer coverages of metal adatoms per cycle, may result in a high quality crystalline Group III-V compound formed via a relatively low temperature process without detrimental gas phase reactions between the Group III and Group V precursors. Optionally, an exposure to excited hydrogen-containing species may be done in a separate environment to assist in managing metal droplet formation and/or reduce carbon contamination. Optionally, in-situ thin film measurements may be done in a separate environment which is maintained for optimal stability and repeatability of the measurements, and the data from these measurements may be used for real-time closed loop control of the deposition and hydrogen environments.

In embodiments of the invention, controllers and systems are provided for controlling and regulating Group III-V thin film formation. In one embodiment, a control system is provided to control various process parameters, such as, for example, substrate and/or substrate holder (or susceptor) temperature, reactor pressure, reaction space pressure, reaction chamber pressure, plasma generator pressure, the flow rate of gas (e.g., $N_2$) into a plasma generator, the flow rate of gas (e.g., metalorganic species) into a reaction space, the rate at which the substrate is moved from one reaction space to another, the rate at which the substrate rotates during thin film formation, power to a plasma generator (e.g., direct current or radio frequency power), and a vacuum system in fluid communication with the reaction chamber. The vacuum system may comprise various pumps configured to provide vacuum to the reaction chamber, such as, e.g., one or more of a turbomolecular ("turbo") pump, a cryopump, an ion pump and a diffusion pump, in addition to a backing pump, such as a mechanical pump.

Group III-V Thin Films

In another aspect of the invention, Group III-V thin films are provided. Group III-V thin films may be formed according to methods provided herein. The Group III-V thin film may include one or more materials selected from gallium nitride, indium gallium nitride, aluminum nitride, indium nitride, aluminum gallium nitride, indium gallium aluminum nitride, or combinations thereof.

Figure 5:
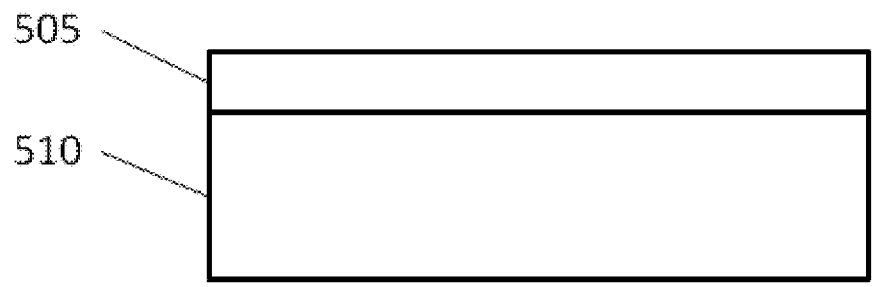
FIG. 5 shows a structure having a Group III-V thin film formed over a substrate, in accordance with an embodiment of the invention.

With reference to FIG. 5, a structure (or device) is shown having a Group III-V thin film 505 formed on a substrate 510, in accordance with an embodiment of the invention. The thin film 505 may be formed according to any method provided herein, such as the methods discussed in the context of FIG. 1. In addition, the thin film 505 may be formed using any device, apparatus or system provided herein, such as the apparatus of FIG. 2 or any of the systems of FIG. 3. The substrate 510 may be selected from silicon, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The substrate 510 may be a chemically doped substrate (e.g., doped n-type or p-type), or intrinsic.

The device of FIG. 5 may be suitable for various applications. For example, the thin film 505 of FIG. 5 may be employed in electronics devices, such as photovoltaic solar cells. The Group III-V thin film 505 may be used in various semiconductor applications or devices, such as optoelectronic applications, including light emitting diodes (LED) (e.g., GaN based violet laser diodes); field effect transistors (FET), including metal-oxide semiconductor FET (MOSFET) and metal semiconductor FET (MESFET) devices; and transistors, including high electron mobility transistors (HEMT). The compositions and thicknesses of the Group III-V thin film 505 and substrate 510 may be selected in accordance with device applications.

In some embodiments, Group III-V thin films formed according to methods provided herein may have defect (e.g., misfit dislocations, such as threading and/or edge dislocation) densities of at most about $10^6$ dislocations/cm$^2$, or at most about $10^7$ dislocations/cm$^2$, or at most about $10^8$ dislocations/cm$^2$, or at most about $10^9$ dislocations/cm$^2$, or at most about $10^{10}$ dislocations/cm$^2$. In some embodiments, defect densities of Group III-V thin films may be between about $10^6$ dislocations/cm$^2$ and $10^{10}$ dislocations/cm$^2$.

In some embodiments, Group III-V thin films (e.g., GaN thin films) formed according to methods provided herein may have a root mean square of the height differences measured by atomic force microscopy (AFM), of less than or equal to about 0.5 nanometers ("nm"), or less than or equal to about 1 nm, or less than or equal to about 1.5 nm, or less than or equal to about 2 nm, or less than or equal to about 2.5 nm, or less than or equal to about 3 nm, or less than or equal to about 3.5 nm, or less than or equal to about 4 nm, or less than or equal to about 4.5 nm, or less than or equal to about 5 nm, or less than or equal to about 6 nm, or less than or equal to about 7 nm, or less than or equal to about 8 nm, or less than or equal to about 9 nm, or less than or equal to about 10 nm.

The crystalline quality of Group III-V thin films formed according to methods provided herein may be probed by an x-ray diffraction measurement, such as the full-width at half maximum of the omega scan of the (0002) or (10$\bar{1}$2) x-ray reflections. In some embodiments, the full-width at half maximum of the (0002) or (10$\bar{1}$2) crystallographic reflections of Group III-V thin films formed according to methods provided herein may be less than or equal to about 100 arcseconds, or less than or equal to about 200 arcseconds, or less than or equal to about 300 arcseconds, or less than or equal to about 400 arcseconds, or less than or equal to about 500 arcseconds, or less than or equal to about 600 arcseconds.

In some embodiments, an indium-containing Group III-V thin film may have a fractional indium concentration, $In_x Z_{(1-x)} N$ ("InZN"), wherein 'x' is a number greater than zero and less than one, 'N' is nitrogen, and 'Z' is a Group III species. In some embodiments, "x' may be at most about 0.99, or at most about 0.9, or at most about 0.8, or at most about 0.7, or at most about 0.6, or at most about 0.5, or at most about 0.4, or at most about 0.3, or at most about 0.2, or at most about 0.1. In some embodiments, InZN thin films may comprise one or more layers of a light emitting diode (LED) heterostructure device. In some embodiments, InZN thin films may comprise one or more layers of a quantum well heterostructure device. In some embodiments, InZN thin films may comprise one or more layers of a multiple quantum well heterostructure device.

In some embodiments, InGaN thin films formed according to methods provided herein may have a fractional indium concentration, $In_x Ga_{(1-x)} N$, wherein 'x' is a number greater than zero and less than one. In some embodiments, "x' may be at most about 0.99, or at most about 0.9, or at most about 0.8, or at most about 0.7, or at most about 0.6, or at most about 0.5, or at most about 0.4, or at most about 0.3, or at most about 0.2, or at most about 0.1. In some embodiments, InGaN thin films may comprise one or more layers of a light emitting diode (LED) heterostructure device. In some embodiments, InGaN thin films may comprise one or more layers of a quantum well heterostructure device. In some embodiments, InGaN thin films may comprise one or more layers of a multiple quantum well heterostructure device.

Example

A system, such as the system of FIG. 2, includes four reaction spaces disposed in relation to one another adjacently along a circumference. A substrate, heated to a temperature of about 700° C., is provided in a first reaction space and contacted with trimethylgallium at a pressure of about 0.5 Torr. The first exposure of trimethylgallium is sufficient to form a gallium thin film at a coverage of about 0.5 ML. Next, the substrate, heated to a temperature of about 700° C., is rotated to a second reaction space and contacted with excited hydrogen-containing species, including hydrogen radicals and ions, at a pressure of about 0.5 Torr. Excited hydrogen-containing species are formed by providing plasma power of about 500 Watts to $H_2$. Next, the substrate, heated to a temperature of about 700° C., is rotated to a third reaction space and contacted with a mixture of $N_2$ and $H_2$, at a pressure of about 0.5 Torr. Plasma power of about 500 Watts is provided to the mixture to generate excited species of $N_2$ and $H_2$. Plasma power is sufficient to generate active neutral species of nitrogen having the lowest excited state of molecular nitrogen ($A^3\Sigma_u^+$). Next, the substrate, heated to a temperature of about 700° C., is rotated to a fourth reaction space and contacted with excited hydrogen-containing species, including hydrogen radicals and ions, at a pressure of about 0.5 Torr. Next, the substrate is rotated to the first reaction space, and the steps above are repeated to provide a Group III-V thin film having, in total, a thickness of about 4000 nanometers ("nm").

Method and systems of embodiments of the invention may be combined with, or modified by, other systems and methods. For example, methods and systems of embodiments of the invention may be combined with, or modified by, methods and systems described in U.S. Pat. No. 6,305,314, U.S. Pat. No. 6,451,695, U.S. Pat. No. 6,015,590, U.S. Pat. No. 5,366,555, U.S. Pat. No. 5,916,365, U.S. Pat. No. 6,342,277, U.S. Pat. No. 6,197,683, U.S. Pat. No. 7,192,849, U.S. Pat. No. 7,537,950, U.S. Pat. No. 7,326,963, U.S. Pat. No. 7,491,626, U.S. Pat. No. 6,756,318, U.S. Pat. No. 6,001,173, U.S. Pat. No. 6,856,005, U.S. Pat. No. 6,869,641, U.S. Pat. No. 7,348,606, U.S. Pat. No. 6,878,593, U.S. Pat. No. 6,764,888, U.S. Pat. No. 6,690,042, U.S. Pat. No. 4,616,248, U.S. Pat. No. 4,614,961, U.S. Patent Publication No. 2006/0021574, U.S. Patent Publication No. 2007/0141258, U.S. Patent Publication No. 2007/0186853, U.S. Patent Publication No. 2007/0215036, U.S. Patent Publication No. 2007/0218701, U.S. Patent Publication No. 2008/0173735, U.S. Patent Publication No. 2009/0090984, U.S. Patent Publication No. 2010/0210067, Patent Cooperation Treaty ("PCT") Publication No. WO/2003/041141, PCT Publication No. WO/2006/034540 and PCT Publication No. WO/2010/091470, and PCT Publication No. WO/2010/092482, which are entirely incorporated herein by reference.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of embodiments of the invention herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A method for forming a thin film, comprising:
    contacting a substrate in a first reaction space with a first precursor to form a first metal layer at sub-monolayer coverage;
    contacting the first metal layer with hydrogen-containing species in a third reaction space; and
    contacting the substrate in a second reaction space with a Group V precursor after contacting the first metal layer with hydrogen, wherein the Group V precursor comprises a nitrogen containing species and wherein the nitrogen-containing species comprises active neutral species of nitrogen;
    wherein the first precursor comprises at least one of a Group III element.

2. The method of claim 1, wherein the first reaction space is fluidically separated from the second reaction space.

3. The method of claim 1, wherein contacting the substrate with the first precursor forms a non-self limiting layer of the first metal layer over the substrate.

4. The method of claim 1, wherein the active neutral species of nitrogen comprises nitrogen species having the lowest excited state of molecular nitrogen ($A^3:\Sigma_u^+$).

5. The method of claim 4, wherein the nitrogen-containing species is selected from the group consisting of $N_2$, $NH_3$, $N_2H_2$, and a mixture of $N_2$ and $H_2$.

6. The method of claim 1, wherein the second precursor comprises plasma activated species of a Group V containing molecule.

7. The method of claim 1, wherein the Group V precursor comprises plasma activated nitrogen-containing species.

8. The method of claim 1, wherein contacting the substrate in the second reaction space with the Group V precursor comprises providing a Group V precursor and a hydrogen containing species.

9. The method of claim 1, wherein the first precursor comprises a gallium containing species.

10. The method of claim 1, wherein the first precursor is selected from the group consisting of boron (B), aluminum (AI), gallium (Ga) and indium (In).

11. The method of claim 1, wherein the first precursor comprises a metalorganic species.

12. The method of claim 1, wherein contacting the substrate in the first reaction space with the first precursor forms a layer of a first metal layer having a thickness up to about 1 monolayer (ML).

13. The method of claim 1, wherein contacting the substrate in the second reaction space with the Group V precursor forms a Group III-V thin film having a thickness less than 1 mL.

14. The method of claim 1, wherein the thin film is a Group III metal nitride thin film.

15. The method of claim 1, further comprising heating the substrate while forming the thin film.

16. The method of claim 1, wherein the hydrogen-containing species is selected from the group consisting of hydrogen ($H_2$) and excited species of hydrogen.

17. The method of claim 1, further comprising contacting the thin film with hydrogen-containing species in a third reaction space.

18. The method of claim 17, wherein the hydrogen-containing species are selected from hydrogen ($H_2$) and excited species of hydrogen.

19. The method of claim 1, wherein the Group III-V thin film comprises $In_xGa_{(1-x)}N$, wherein 'x' is a number greater than 0 and less than 1.

* * * * *